(12) United States Patent
Li et al.

(10) Patent No.: US 7,012,324 B2
(45) Date of Patent: Mar. 14, 2006

(54) LEAD FRAME WITH FLAG SUPPORT STRUCTURE

(75) Inventors: Gary G. Li, Gilbert, AZ (US); Michael E. S. Chapman, Gilbert, AZ (US); Dave S. Mahadevan, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 199 days.

(21) Appl. No.: 10/660,828

(22) Filed: Sep. 12, 2003

(65) Prior Publication Data

US 2005/0056920 A1 Mar. 17, 2005

(51) Int. Cl.
*H01L 23/495* (2006.01)

(52) U.S. Cl. ............... 257/676; 257/670; 257/669; 257/674

(58) Field of Classification Search ......... 257/666–667, 257/669–670, 672, 674–676, 678, 685–686, 257/690–692, 696, 773, 777, 786, 792, 796, 257/723

See application file for complete search history.

(56) References Cited

U.S. PATENT DOCUMENTS

| | | | |
|---|---|---|---|
| 4,829,362 A | 5/1989 | Tran et al. | |
| 4,924,291 A | 5/1990 | Lesk et al. | |
| 5,019,893 A | 5/1991 | Frank et al. | |
| 5,049,973 A | 9/1991 | Satriano et al. | |
| 5,068,764 A | 11/1991 | Bland et al. | |
| 5,233,222 A | 8/1993 | Djennas et al. | |
| 5,327,008 A | 7/1994 | Djennas et al. | |
| 5,381,036 A | 1/1995 | Bigler et al. | |
| 5,424,576 A | 6/1995 | Djennas et al. | |
| 5,565,749 A | 10/1996 | Jinno et al. | |
| 5,594,234 A | 1/1997 | Carter, Jr. et al. | |
| 5,683,944 A * | 11/1997 | Joiner et al. | 438/122 |
| 5,767,443 A | 6/1998 | Farnworth et al. | |
| 5,773,878 A | 6/1998 | Lim et al. | |
| 5,856,911 A | 1/1999 | Riley | |
| 5,910,640 A | 6/1999 | Farnworth et al. | |
| 5,930,601 A | 7/1999 | Cannizzaro et al. | |
| 5,969,949 A | 10/1999 | Kim et al. | |
| 5,969,950 A | 10/1999 | Tantoush | |
| 6,049,125 A | 4/2000 | Brooks et al. | |
| 6,081,029 A | 6/2000 | Yamaguchi | |
| 6,326,242 B1 | 12/2001 | Brooks et al. | |
| 6,358,775 B1 | 3/2002 | Hsia | |
| 6,399,423 B1 * | 6/2002 | Matsuura et al. | 438/123 |
| 2004/0022016 A1 | 2/2004 | Mosna | |

FOREIGN PATENT DOCUMENTS

| | | | |
|---|---|---|---|
| DE | 10106838 | * | 2/2004 |
| EP | 0 409 196 A2 | | 3/1997 |
| EP | 0 887 850 A2 | | 12/1998 |
| JP | 55009401 | | 1/1980 |
| JP | 452 634 A1 | | 2/1991 |
| JP | 09064266 | | 3/1997 |
| JP | 10321791 | | 12/1998 |

* cited by examiner

*Primary Examiner*—Hoai Pham
*Assistant Examiner*—Dilinh Nguyen
(74) *Attorney, Agent, or Firm*—David G. Dolezal

(57) ABSTRACT

A lead frame (201) for a packaged electronic device having split flag structures (205, 207) coupled by support structures (219). The support structures include bend portions (233) for providing stress relief between the flag structures during the manufacture and/or during the operation of a packaged electronic device (301). In one embodiment, the packaged electronic device includes an inertial sensor (515).

33 Claims, 3 Drawing Sheets

LEAD FRAME WITH FLAG SUPPORT STRUCTURE

BACKGROUND OF THE INVENTION

1. Field of the Invention

This invention relates in general to packaged electronic devices and specifically to lead frames for packaged electronic devices.

2. Description of the Related Art

Electrical circuits such as integrated circuits can be implemented in packaged electronic devices. A packaged electronic device may include one or more lead frames and one or more die for implementing electrical circuits of the packaged electronic device. In some embodiments, the die and lead frame(s) may be encapsulated with an encapsulant.

Because the packaging of die includes different materials (e.g. metal, encapsulant), temperature variations may cause the packaged die to be stressed during manufacture and operating conditions due to the differences in thermal expansion and other material properties of the different materials. For some packaged electronic devices that include some types of circuits and transducers (e.g. a sensor), this stress may affect the operation of the device.

FIG. 1 is a partial cross sectional view of a prior art packaged electronic device. Packaged electronic device 101 includes a first die 105 and a second die 107 attached to the top of die 105. Die 105 and die 107 are utilized to implement a sensor. Located between die 105 and lead frame 103 are four rubber or adhesive pads (with rubber or adhesive pads 113 and 111 being shown in FIG. 1). The rubber pads isolate die 105 from stress along lead frame 103. The rubber or adhesive pads are attached to a flag structure of lead frame 103. Prior to encapsulation, die 105, die 107 and the rubber pads are enclosed in a gel 109 for further stress isolation. This stress isolation may be done for the sensor to function electrically within accepted specifications in the operating temperature range. After wire bonding, the entire assembly is encapsulated with encapsulant 115 at an elevated temperature. After cooling back to room temperature, an air gap (not shown) is formed between the gel and encapsulant due to a much faster shrinkage of the gel compared to the encapsulant. The air gap shields die 105 and die 107 from the packaging stress caused by encapsulant 115 and lead frame 103.

Such a stress isolation process is complicated and the process control is often difficult. In addition, to accommodate the inclusion of the gel, the resulting package that is simpler, smaller, and with significantly reduced packaging stress to an electronic device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
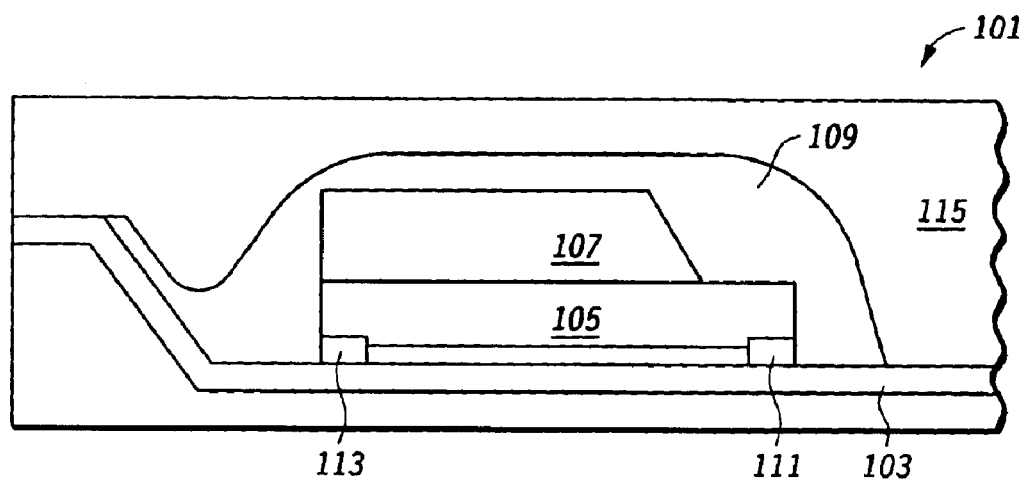
FIG. 1 is a partial cross sectional view of a prior art packaged electronic device.
Figure 2:
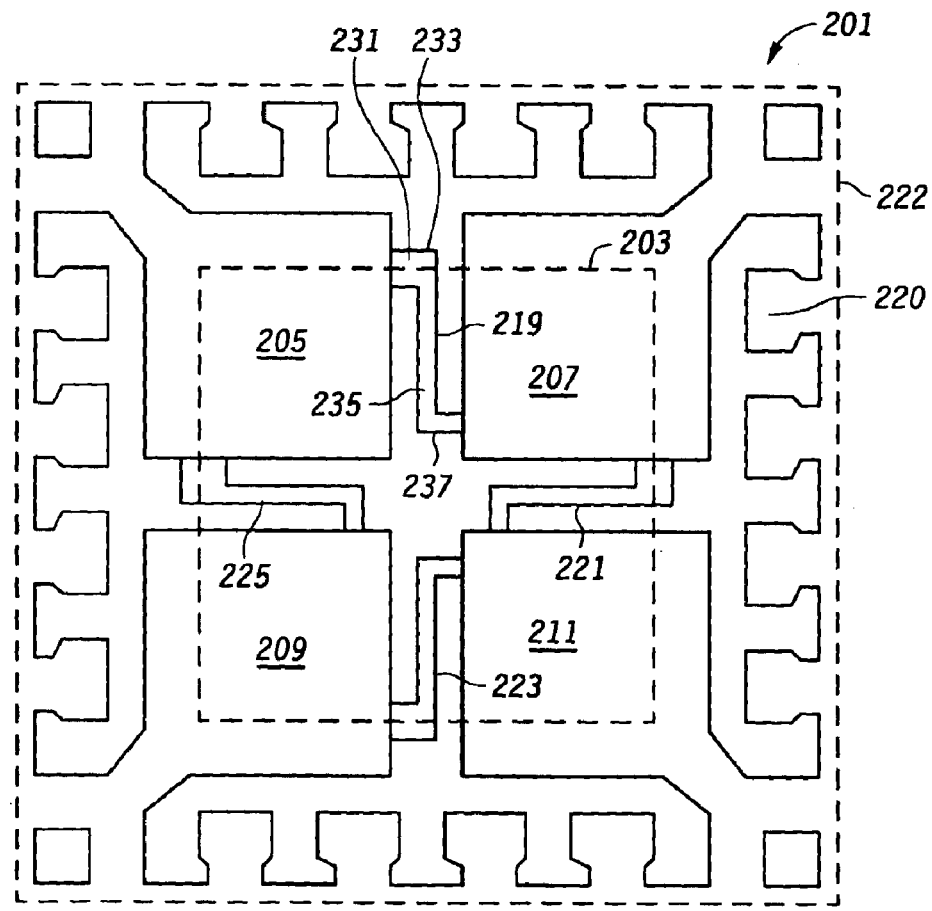
FIG. 2 is a top view of one embodiment of a lead frame for a packaged electronic device according to the present invention.

FIG. 2 shows a top view of a lead frame for a packaged electronic device according to the present invention. Lead frame 201 includes a die mounting location 203 located on its top side (relative to the view shown in FIG. 2). Die mounting location 203 defines the location of a die with respect to a lead frame in a packaged electronic device. Lead frame 201 includes four split flag structures 205, 207, 209, and 211. The top side of each flag structure includes a portion of die mounting location 203.

Figure 3:
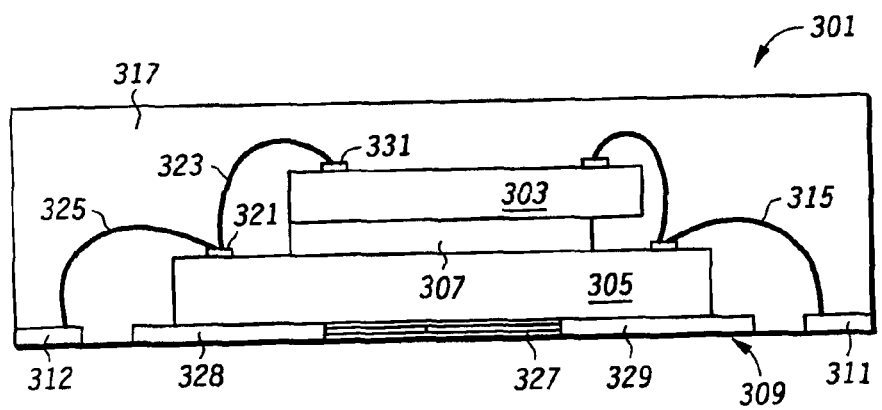
FIG. 3 is cut away side view of one embodiment of a packaged electronic device according to the present invention.

In the embodiment shown, lead frame 201 also includes wire bond pads (e.g. 220) where wires (not shown) are bonded for coupling to the bond pads (not shown) of the die via bond wires (e.g. 315 of FIG. 3). After encapsulating lead frame 201 and die, portions (e.g. 222) of lead frame 201 are trimmed.

In other embodiments, the bottom sides (relative to the view shown in FIG. 2) of the wire bond pads (e.g. 220) are exposed from encapsulation to serve as bond pads for external coupling of the die to e.g. a printed circuit board. With other embodiments, other types of external conductive structures (e.g. balls or bumps) may be coupled to the wirebond pads of the lead frame for external coupling of the die.

Lead frame 201 includes support structures 219, 221, 223, and 225 located between flag structures 205, 207, 209, and 211. Support structures 219, 221, 223, and 225 provide support for the flag structures prior to the encapsulation. Each support structure (e.g. 219) includes at least one bend portion (e.g. 233) for providing stress relief between the two flag structures (e.g. 205 and 207) and die. The bend portions of the support structures allow for the flag structures to move laterally with respect to each other to reduce stress of the package during manufacture as well as during the operation of the device. In one embodiment, the lateral movement includes lateral movement of the flag structures in a direction extending between the flag structures. In other embodiments, lead frame 201 may include a lesser number of greater number of split flag structures with support structures located there between.

In the embodiment shown, the support structures (e.g. 219) each have an "S" form with the portions of the support structure connected at 90 degree angles with each other. For example, portion 231 is connected to portion 235 to a 90 degree angle. Portion 237 is connected to portion 235 at a 90 degree angle. Portion 231 is connected to flag structure 205 and portion 237 is connected at flag structure 207.

In other embodiments, the support structures may have other forms such as forms having rounded corners. With some embodiments, the support structures may have a zig zag form. With some of these forms, portions of the support structure may extend from the flag structures at non 90 degree angles.

Lead frame 201 is formed from a sheet (not shown) of suitable lead frame material (e.g. copper) using any one of a number of forming processes. In forming one embodiment of a lead frame, the sheet of lead frame material is stamped and/or chemically etched with a pattern that includes patterns for multiple lead frames (e.g. 201). In some embodiments, the lead frame patterns are arranged in columns and rows in the sheet.

FIG. 3 is a side view of an embodiment of a packaged electronic device according to the present invention. Packaged electronic device 301 includes a bottom die 305 and a top die 303 located in a stacked die configuration with a spacer 307 located there between. Some embodiments do not include spacer 307. Die 305 is mounted to lead frame 309 at a die mounting location of lead frame 309. In one embodiment, packaged electronic device 301 is a packaged sensor device with a transducer being implemented in one of die 303 and die 305 and a signal controller application specific integrated circuit (ASIC) being implemented in the other of die 303 and die 305 for converting the mechanical signal into an electrical signal. In some embodiments, the transducer and signal controller maybe implemented in the same die.

Lead frame 309 is similar to lead frame 201 in that it includes four split flag structures with flag structures 328 and 329 shown in FIG. 3. Lead frame 309 also includes four support structures coupled between the split flag structures with support structure 327 shown in FIG. 3 coupling flag structures 328 and 329 together. The support structure (e.g. 327) of lead frame 309 include bend portions for providing stress relief.

Lead frame 309 includes wire bond pads (e.g. 311 and 312). Bond wires (e.g. 325) are bonded to bond pads (e.g. 321) of die 305 and to the wire bond pads of lead frame 309. Packaged electronic device 301 also include bond wires (e.g. 323) that couple the bond pads of die 303 (e.g. 331) to the bond pads (e.g. 321) of die 305. Although, FIG. 3 shows only two die bond pads for die 303 and die 305, die in other embodiments may include more.

In one embodiment, die 303 includes a mechanical sensing structure (MEMS) and die 305 includes a signal conditioning controller. In one embodiment, packaged electronic device 301 is configured in a Quad Flat No-Leads (QFN) configuration. However a lead frame having a support structure coupling flag structures may be implemented in packaged electronic devices of other types of package configurations such as e.g. plastic dual in-line package (PDIP), small outline integrated circuit (SOIC), and ball grid array (BGA), etc.

In one embodiment, lead frame 309 is formed from a sheet of lead frame material (not shown). In one embodiment, the sheet is a 8"×2.5" copper plate having a thickness of between 5 to 15 mils, but may have other dimensions in other embodiments. The sheet is stamped to define multiple lead frames in rows and columns. In other embodiments, the sheet of lead frame material may be patterned by etching. After the lead frames in the sheet have been defined, the support structures are etched from both the top and bottom of the sheet of lead frame material to reduce the thickness of the support structures. In the embodiment of FIG. 3, the support structures (e.g. 327) are about half the width of the split flag structures (e.g. 328 and 329). Reducing the thickness of the support structures (e.g. 327) allows the support structure to be encapsulated without the bottom of the support structure being exposed from encapsulation.

After the lead frames have been formed in the sheet of lead frame material, the die are attached to the lead frames at the die mounting locations. In one embodiment, the die are attached to the lead frames with conductive epoxy. In other embodiments, the die are attached by attaching the die to pads or spacers attached to the lead frame at the pad mounting locations. Afterwards, the bond pads (e.g. 321) of the die (e.g. 305) are wire bonded to the bond pads (e.g. 312) of the lead frames.

With some packaged electronic devices having a stacked die configuration, spacers (e.g. 307) are then attached to the top sides of the bottom die (e.g. 305). Top die (e.g. 303) are attached to the opposite sides of the spacers. The bond pads (e.g. 331) of the top die (e.g. 303) are wire bonded to bond pads (e.g. 321) of the bottom die. The resultant sheet and attached die are then encapsulated in an encapsulant (e.g. 317). The encapsulated structure is then cut to singulate the packaged electronic devices. The packaged electronic devices are then tested and shipped. Packaged electronic devices of other configurations may be manufactured by other processes.

One advantage that may occur with a lead frame having flag structures coupled by a support structure having at least one bend portion is that it provides stress relief for a lead frame of a packaged electronic device during its manufacture and during operation. With some embodiments, the use of support structures to couple split flag structures may reduce or eliminate the need for a gel (e.g. 109) or rubber pads (e.g. 113) in the packaged electronic device. Accordingly, problems associated with different temperature coefficients between the gel and encapsulant (e.g. gaps) may be eliminated or significantly reduces as well as the cost and complexity of the manufacture of the packaged electronic device may be reduced as well. Another advantage of adopting such a lead frame design in a QFN configuration is that it may result in a package with a significantly smaller footprint. Providing a support structure coupling these flag structures and having at least a portion of the support structure between two flag structures may reduce stress during encapsulation and provides support between the two flag structures during manufacture.

Figure 4:
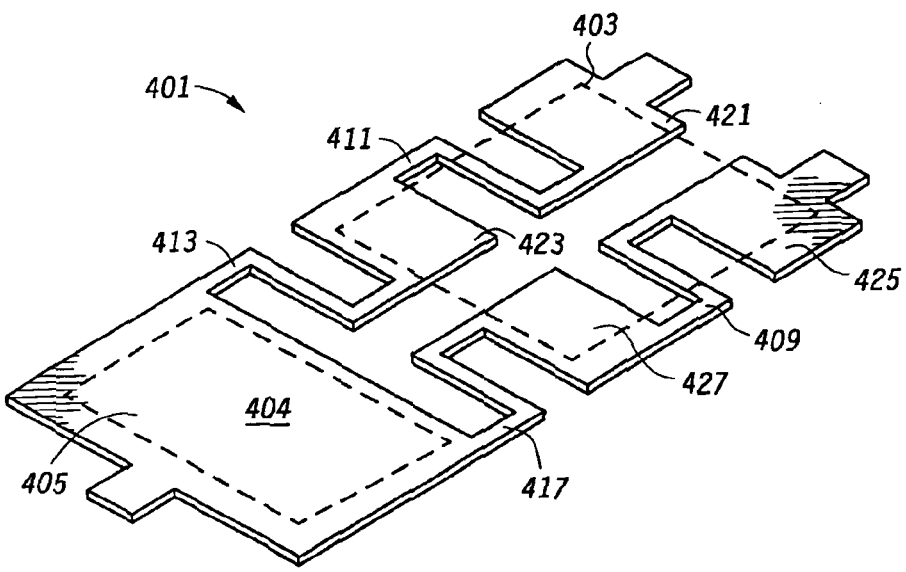
FIG. 4 is a perspective view of another embodiment of a lead frame according to the present invention.

FIG. 4 is a perspective view of another lead frame according to the present invention. Lead frame 401 includes two die mounting locations 405 and 403. Die mounting location 403 is located at a first side of four split flag structures 421, 423, 425, and 427. Die mounting location 405 is located at a first side of flag structure 404. Flag structures 421 and 423 are coupled via a support structure 411 which has two bend portions, and flag structures 425 and 427 are coupled via support structure 409. In the embodiment shown, flag structure 423 is coupled to flag structure 404 via a support structure 413 having a bend portion, and flag structure 427 is coupled to flag structure 404 via support structure 417.

In one embodiment of a packaged sensor device including lead frame 401, a die including a transducer is located at die mounting location 403 and a die including a signal controller operably coupled to the transducer of the die is located at die mounting location 405. Such a packaged sensor device configuration can be used to implement an inertial sensor. In some embodiments, the signal controller would be operably coupled to other circuitry (not shown) external to the packaged electronic device. With other embodiments, such a packaged sensor device configuration maybe used to implement other types of sensors.

Figure 5:
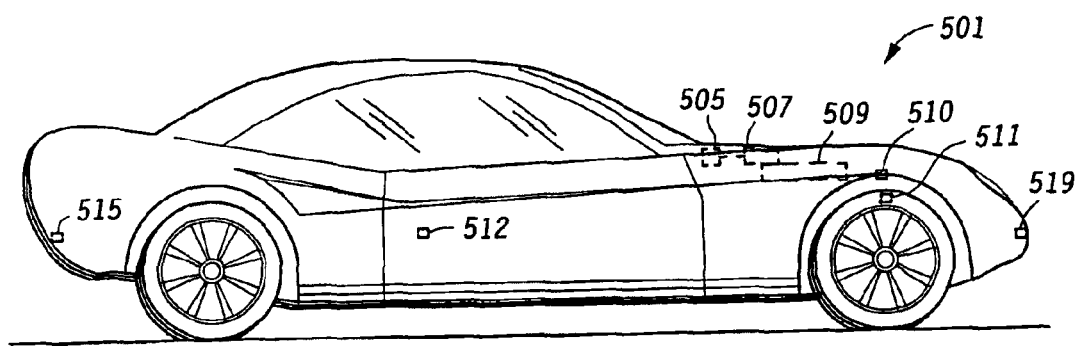
FIG. 5 is a side view of an automobile implementing a packaged electronic device according to the present invention.

FIG. 5 is a side view of one embodiment of a car according to the present invention. Car 501 includes a number of packaged electronic devices (e.g. 515, 505, 512,

511, 510, and 519) that include a lead frame with two flag structures coupled with a structure having a bend portion. These packaged electronic devices implement accelerometers or other types of inertial sensors such as e.g. angular sensors for measuring angular velocity or acceleration. Packaged electronic devices 515, 519, and 512 provide acceleration sensing for air bag deployment. Packaged electronic device 505 provides central crash sensing. Other packaged electronic devices can be utilized for providing rollover detection. Packaged electronic device 511 is utilized to provide braking detection. Car 501 may include other packaged electronic devices for providing other sensed information including side impact detection. These packaged electronic devices each include an inertial sensor. Each of the packaged electronic devices is operably coupled to a central controller (e.g. by a wired coupling or wireless coupling) for providing the information sensed by the sensing circuitry of the packaged electronic device to the central controller for operation. Packaged electronic devices as shown and described above may be implemented in other types of automobiles such as e.g. trucks, pickups, SUVs, motorcycles, and vans.

Figure 6:
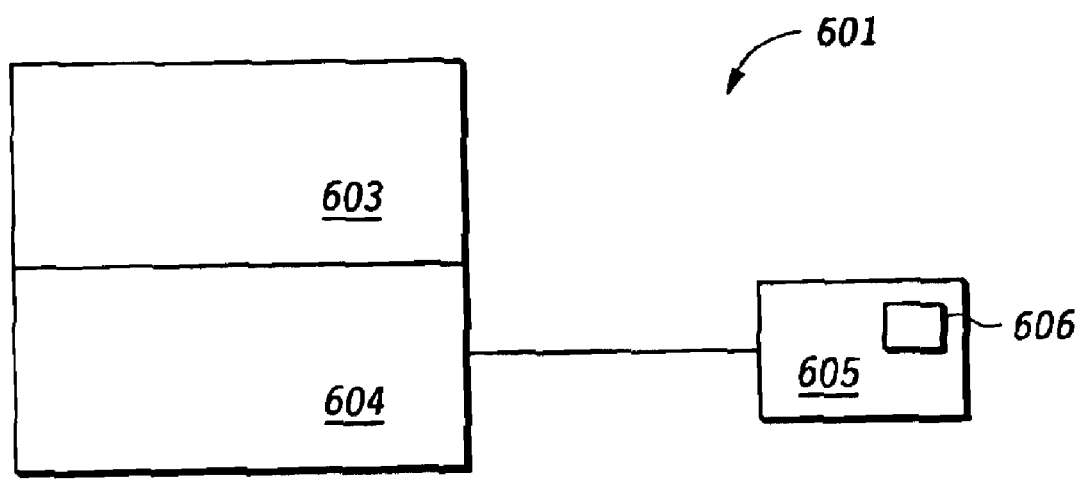
FIG. 6 is a block diagram of a video game device implementing a packaged electronic device according to the present invention.

FIG. 6 is a block diagram of one embodiment a video game device according to the present invention. Video game device 601 includes a screen 603, control unit 604, and hand held peripheral unit 605 which is operably coupled to control unit 605 via e.g. a wired coupling or wireless coupling. Some video game devices do not include a screen, wherein control unit 605 is operably couplable to a television to provide image information for display. Peripheral unit 605 includes an inertial sensor 606 implemented in a packaged electronic device having a lead frame similar to lead frame 401 or lead frame 201. In some embodiments, the screen 603, control unit 604, and peripheral unit 605 are implemented in one housing.

Packaged electronic devices having lead frames similar to those described above may be implemented in other types of devices such as airplanes, cell phones, appliances, space craft and other space devices, or other devices requiring inertia and/or gyration detection. Furthermore, lead frames similar to those described above may be included in packaged electronic devices with die implementing other types of circuitry such as e.g. micro controllers, digital signal processors, logic circuitry, and memories.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A packaged electronic device comprising:
    a die; and
    a lead frame, the die being located with respect to the lead frame at a first die mounting location of the lead frame, the lead frame comprising:
        a first flag structure having a first side, the first side including a portion of the die mounting location;
        a second flag structure having a first side, the first side of the second flag structure including a portion of the die mounting location; and
        a structure connected to the first flag structure and to the second flag structure, the structure including a bend portion, the structure including at least a portion located between the first flag structure and the second flag structure;
    wherein:
        the first flag structure is of a first thickness between the first side and a second side of the first flag structure, the second side of the first flag structure opposing the first side;
        the second flag structure is of the first thickness between the first side and a second side of the second flag structure, the second side of the second flag structure opposing the first side;
        at least a portion of the structure is of a second thickness between a first side of the structure and the second side of the structure, the first side of the structure is generally parallel to the first side of the first flag structure and the first side of the second flag structure, and the second side of the structure is generally parallel to the second side of the first flag structure and the second side of the second flag structure, wherein the second thickness is less than the first thickness.

2. The packaged electronic device of claim 1 wherein the structure has a form to provide for movement of the first flag structure with respect to the second flag structure, wherein the movement includes lateral movement of the first flag structure with respect to the second flag structure in a direction extending between the first flag structure and the second flag structure.

3. The packaged electronic device of claim 1 wherein the structure is integrally connected to the first flag structure and to the second flag structure.

4. The packaged electronic device of claim 1 wherein the bend portion includes a first portion connected to the first flag structure, and a second portion extending from the first portion.

5. The packaged electronic device of claim 4 wherein the second portion extends from the first portion at generally a 90 degree angle.

6. The packaged electronic device of claim 5 wherein the structure includes a third portion extending between the second portion and the second flag structure.

7. The packaged electronic device of claim 6 wherein the third portion extends from the second portion at generally a 90 degree angle.

8. The packaged electronic device of claim 1 wherein a bend of the bend portion is generally 90 degrees.

9. The packaged electronic device of claim 1 wherein the die includes a transducer.

10. The packaged electronic device of claim 1 wherein the die is attached to the first side of the first flag structure and to the first side of the second flag structure at the die mounting location.

11. The packaged electronic device of claim 1 wherein at least a portion of the die and at least a portion of the lead frame is encapsulated with an encapsulant.

12. The packaged electronic device of claim 1 wherein the lead frame further comprises:
    a third flag structure having a first side, the first side including a portion of the die mounting location;
    a second structure connected to the first flag structure and to the third flag structure, the second structure including a second bend portion, at least a portion of the second structure located between the first flag structure and the third flag structure.

13. The packaged electronic device of claim 12 further comprising:
    a fourth flag structure having a first side, the first side of the fourth flag structure including a portion of the die mounting location;

a third structure connected to the second flag structure and to the fourth flag structure, the third structure including a third bend portion, the third structure including at least a portion located between the second flag structure and the fourth flag structure.

14. The packaged electronic device of claim 13 further comprising:
a fourth structure connected the third flag structure and to the fourth flag structure, the fourth structure including a fourth bend portion, the fourth structure including at least a portion located between the third flag structure and the fourth flag structure.

15. The packaged electronic device of claim 1 wherein the lead frame further comprises:
a third flag structure having a first side, the first side including a portion of the die mounting location;
a fourth flag structure having a first side, the first side of the fourth flag including a portion of the die mounting location;
a second structure connected to the third flag structure and to the fourth flag structure, the second structure including a second bend portion, at least a portion of the second structure located between the third flag structure and the fourth flag structure.

16. The packaged electronic device of claim 1 wherein the structure is generally located in a plane defined on a first side by the first side of the first flag structure and the first side of the second flag structure, wherein the plane is defined on a second side by a second side of the first flag structure and a second side of the second flag structure, the second side of the first flag structure is an opposing side of the first side of the first flag structure, the second side of the second flag structure is an opposing side to the first side of the second flag structure.

17. The lead frame of claim 1 wherein at least a portion of the structure has generally an "S" form.

18. An automobile including the packaged electronic device of claim 1.

19. The packaged electronic device of claim 1 further comprising:
a second die located over the die in a stacked die configuration.

20. The packaged electronic device of claim 1 wherein the packaged electronic device is characterized as a Quad Flat No-Leads (QFN) packaged electronic device.

21. A packaged electronic device comprising:
a die;
a lead frame, the die being located with respect to the lead frame at a first die mounting location of the lead frame, the lead frame comprising:
a first flag structure having a first side, the first side including a portion of the die mounting location;
a second flag structure having a first side, the first side of the second flag structure including a portion of the die mounting location; and
a structure connected to the first flag structure and to the second flag structure, the structure including a bend portion, the structure including at least a portion located between the first flag structure and the second flag structure;
a second die, the second die being located with respect to the lead frame at a second die mounting location of the lead frame, the lead frame includes a third flag structure having a first side including at least a portion of the second die mounting location,
wherein the lead frame includes a second structure connected to the first flag structure and to the third flag structure, the second structure including a second bend portion, the second structure including at least a portion located between the first flag structure and the third flag structure.

22. The packaged electronic device of claim 21 wherein the die includes a transducer and the second die includes a signal controller operably coupled to the transducer.

23. The packaged electronic device of claim 21 wherein the die includes a transducer and the second die includes a signal controller operably coupled to the transducer.

24. A lead frame for a packaged electronic device, the lead frame comprising:
a first flag structure having a first side, the first side including a portion of a die mounting location;
a second flag structure having a first side, the first side of the second flag structure including a portion of the die mounting location;
a structure connected to the first flag structure and to the second flag structure, the structure including a bend portion, the structure including at least a portion located between the first flag structure and the second flag structure;
wherein:
the first flag structure is of a first thickness between the first side and a second side of the first flag structure, the second side of the first flag structure opposing the first side;
the second flag structure is of the first thickness between the first side and a second side of the second flag structure, the second side of the second flag structure opposing the first side;
at least a portion of the structure is of a second thickness between a first side of the structure and the second side of the structure, the first side of the structure is generally parallel to the first side of the first flag structure and the first side of the second flag structure, and the second side of the structure is generally parallel to the second side of the first flag structure and the second side of the second flag structure, wherein the second thickness is less than the first thickness.

25. The lead frame of claim 24 wherein at least a portion of the structure has generally an "S" form.

26. The lead frame of claim 24 wherein the first flag structure has a first edge, the structure extending from the first edge, the second flag structure has a second edge, the structure extending from the second edge, wherein the first edge is generally faces the second edge.

27. An apparatus comprising:
a die;
a lead frame, the die being located with respect to the lead frame at a first die mounting location of the lead frame, the lead frame comprising:
a first flag structure having a first side, the first side including a portion of the die mounting location;
a second flag structure having a first side, the first side of the second flag structure including a portion of the die mounting location; and
a structure connected to the first flag structure and to the second flag structure, the structure including a bend portion, the structure including at least a portion located between the first flag structure and the second flag structure; and
an encapsulant, the encapsulant encapsulating at least a portion of the die and at least a portion of the lead frame;

wherein:
the first flag structure is of a first thickness between the first side and a second side of the first flag structure, the second side of the first flag structure opposing the first side;
the second flag structure is of the first thickness between the first side and a second side of the second flag structure, the second side of the second flag structure opposing the first side;
at least a portion of the structure is of a second thickness between a first side of the structure and the second side of the structure, the first side of the structure is generally parallel to the first side of the first flag structure and the first side of the second flag structure, and the second side of the structure is generally parallel to the second side of the first flag structure and the second side of the second flag structure, wherein the second thickness is less than the first thickness.

28. The apparatus of claim 27 wherein the die includes a transducer.

29. The apparatus of claim 27 further comprising:
a controller, the controller operably coupled to circuitry of the die.

30. The apparatus of claim 27 wherein the apparatus is generally characterized as an automobile.

31. The apparatus of claim 27 wherein the die includes circuitry for an inertial sensor.

32. The apparatus of claim 27 wherein the apparatus is generally characterized as a video game device.

33. An apparatus comprising:
a die;
a lead frame, the die being located with respect to the lead frame at a first die mounting location of the lead frame, the lead frame comprising:
a first flag structure having a first side, the first side including a portion of the die mounting location;
a second flag structure having a first side, the first side of the second flag structure including a portion of the die mounting location; and
a structure connected to the first flag structure and to the second flag structure, the structure including a bend portion, the structure including at least a portion located between the first flag structure and the second flag structure;
an encapsulant, the encapsulant encapsulating at least a portion of the die and at least a portion of the lead frame;
a second die, the second die being located with respect to the lead frame at a second die mounting location of the lead frame, the lead frame includes a third flag structure having a first side including at least a portion of the second die mounting location,
wherein the lead frame includes a second structure connected to the first flag structure and to the third flag structure, the second structure including a second bend portion, the second structure including at least a portion located between the first flag structure and the third flag structure.

* * * * *